(12) United States Patent
Zhao et al.

(10) Patent No.: US 12,176,325 B2
(45) Date of Patent: Dec. 24, 2024

(54) STRETCHABLE DISPLAY PANEL, PREPARATION METHOD THEREFOR, AND DISPLAY APPARATUS

(71) Applicant: BOE Technology Group Co., Ltd., Beijing (CN)

(72) Inventors: Jia Zhao, Beijing (CN); Zheng Liu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 460 days.

(21) Appl. No.: 17/761,523

(22) PCT Filed: May 18, 2021

(86) PCT No.: PCT/CN2021/094412
§ 371 (c)(1),
(2) Date: Mar. 17, 2022

(87) PCT Pub. No.: WO2021/238726
PCT Pub. Date: Dec. 2, 2021

(65) Prior Publication Data
US 2022/0367426 A1    Nov. 17, 2022

(30) Foreign Application Priority Data
May 28, 2020 (CN) .................. 202010467790.X (51) Int. Cl.
*H01L 25/075* (2006.01)
*H01L 23/538* (2006.01)
*H01L 33/62* (2010.01)

(52) U.S. Cl.
CPC ...... *H01L 25/0753* (2013.01); *H01L 23/5387* (2013.01); *H01L 33/62* (2013.01); *H01L 2933/0066* (2013.01)

(58) Field of Classification Search
CPC .. H01L 25/0753; H01L 23/5387; H01L 33/62
(Continued)

(56) References Cited

U.S. PATENT DOCUMENTS

2016/0028043 A1    1/2016  Kwon et al.
2016/0049602 A1    2/2016  Kim
(Continued)

FOREIGN PATENT DOCUMENTS

CN    105074802 A    11/2015
CN    105845702 A    8/2016
(Continued)

OTHER PUBLICATIONS

CN 202010467790 X first office action.

*Primary Examiner* — Andargie M Aychillhum
(74) *Attorney, Agent, or Firm* — IPro, PLLC (57) ABSTRACT

A stretchable display panel, a preparation method therefor, and a display apparatus, relating to the technical field of display. Wherein the stretchable display panel includes an island region (01) disposed with a display apparatus (A), a bridge region (02) disposed with wiring (B), and a hole-region (03). A separation region (10) is disposed at an edge of the island region (01) and/or an edge of the bridge region (02). The separation region (10) includes a slope layer (11) and a plurality of isolation columns (12) disposed along a slope plane of the slope layer (11).

19 Claims, 6 Drawing Sheets

(58) Field of Classification Search
USPC .......................................................... 361/749
See application file for complete search history.

(56) References Cited

U.S. PATENT DOCUMENTS

| | | |
|---|---|---|
| 2016/0227623 A1 | 8/2016 | Yoo |
| 2016/0268352 A1 | 9/2016 | Hong et al. |
| 2018/0046221 A1 | 2/2018 | Choi et al. |
| 2019/0107911 A1* | 4/2019 | Zhai .................... H10K 50/813 |
| 2019/0131377 A1 | 5/2019 | Kwon et al. |
| 2019/0259825 A1 | 8/2019 | Hong et al. |
| 2020/0251682 A1 | 8/2020 | Guo et al. |
| 2021/0064091 A1* | 3/2021 | Wang .................... G06F 1/1652 |
| 2021/0143243 A1 | 5/2021 | Ban |
| 2021/0257434 A1 | 8/2021 | Xie et al. |
| 2022/0376207 A1 | 11/2022 | Ban et al. |

FOREIGN PATENT DOCUMENTS

| | | |
|---|---|---|
| CN | 109860422 A | 6/2019 |
| CN | 109920803 A | 6/2019 |
| CN | 109920818 A | 6/2019 |
| CN | 109935730 A | 6/2019 |
| CN | 110190090 A | 8/2019 |
| CN | 110459583 A | 11/2019 |
| CN | 110970483 A | 4/2020 |
| CN | 111584537 A | 8/2020 |
| EP | 2956923 B1 | 6/2021 |

* cited by examiner

STRETCHABLE DISPLAY PANEL, PREPARATION METHOD THEREFOR, AND DISPLAY APPARATUS

CROSS REFERENCE TO RELEVANT APPLICATIONS

The present disclosure claims the priority of the Chinese patent application filed on May 28, 2020 before the Chinese Patent Office with the application number of 202010467790.X and the title of "STRETCHABLE DISPLAY PANEL, PREPARATION METHOD THEREFOR, AND DISPLAY APPARATUS", which is incorporated herein in its entirety by reference.

TECHNICAL FIELD

The present disclosure relates to the technical field of display technology, and particularly relates to a stretchable display panel, a preparation method therefor, and a display apparatus.

BACKGROUND

Nowadays, as requirements of people for spatial scalability of display apparatus become higher and higher, there are more and more researches on stretchable display panels, which is gradually becoming an important development direction in the field of display technology.

SUMMARY

The present disclosure provides a stretchable display panel, a preparation method therefor, and a display apparatus.

The present disclosure discloses a stretchable display panel, which includes an island region disposed with a display apparatus, a bridge region disposed with wirings and a hole-region, an isolation area is disposed at an edge of the island region and/or an edge of the bridge region, the isolation area includes a slope layer and a plurality of isolation columns disposed along a slope plane of the slope layer.

Optionally, the slope layer includes a flexible substrate and a first buffer layer disposed on the flexible substrate, and the plurality of isolation columns are disposed on the first buffer layer.

Optionally, a slope-plane angle of the flexible substrate is greater than 0 degree and less than or equal to 30 degrees.

Optionally, a slope-plane angle of the first buffer layer is less than a slope-plane angle of the flexible substrate.

Optionally, the stretchable display panel further includes a second buffer layer located between the flexible substrate and the first buffer layer, and the second buffer layer does not overlap with the plurality of isolation columns.

Optionally, the stretchable display panel further includes a second buffer layer located between the flexible substrate and the first buffer layer, and the second buffer layer does not overlap with the slope plane of the first buffer layer.

Optionally, the stretchable display panel further includes a patterned photoresist layer, and the patterned photoresist layer is located on the second buffer layer.

Optionally, the isolation columns include at least one of a cushion layer, a flat layer and a source-drain layer.

Optionally, the isolation area further includes a luminescent-material layer covering the plurality of isolation columns, and an encapsulation layer covering the luminescent-material layer.

The present disclosure also discloses a preparation method for a stretchable display panel, wherein the method includes:
providing a flexible substrate;
forming a second buffer layer on the flexible substrate;
forming a hole-region pattern on the second buffer layer;
performing semi-etching a part of the flexible substrate exposing the hole-region pattern;
performing at least one preset process, until a hole-region is formed on the flexible substrate, and a substrate slope is formed at an edge of an island region configured to dispose a display apparatus and/or an edge of a bridge region configured to dispose wirings;
forming a first buffer layer covering the substrate slope, to obtain a slope layer;
forming a plurality of isolation columns along a slope plane of the slope layer;
wherein, the preset process includes: enlarging the hole-region pattern on the second buffer layer; performing semi-etching a part of the flexible substrate exposing the hole-region pattern after enlarging.

Optionally, forming the hole-region pattern on the second buffer layer includes:
forming a patterned photoresist layer on the second buffer layer; and
performing etching a part of the second buffer layer exposing the patterned photoresist layer, to form the hole-region pattern.

Optionally, before or after performing semi-etching a part of the flexible substrate exposing the hole-region pattern, the method further includes:
through an ashing process, performing etching the photoresist layer along a direction away from the hole-region pattern, to expose a part of the second buffer layer.

Optionally, enlarging the hole-region pattern on the second buffer layer includes:
performing etching the part of the second buffer layer exposing the patterned photoresist layer;
Optionally, performing etching a part of the second buffer layer exposing the photoresist layer includes:
performing etching the part of the second buffer layer exposing the photoresist layer by tetrafluoromethane gas.

Optionally, performing semi-etching the part of the flexible substrate exposing the hole-region pattern includes:
performing semi-etching the part of the flexible substrate exposing the hole-region pattern by oxygen gas.

Optionally, a slope-plane angle of the slope layer is positively correlated with times of performing the preset process.

Optionally, a slope-plane angle of the slope layer is positively correlated with an etching duration of performing semi-etching the part of the flexible substrate exposing the hole-region pattern after enlarging.

Optionally, forming the plurality of isolation columns along the slope plane of the slope layer includes: forming isolation-column films on the slope plane of the slope layer, and forming the plurality of isolation columns located in an isolation area through a patterning process.

The present disclosure further discloses a display apparatus, which including the stretchable display panel as mentioned above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and a person skilled in the art can obtain other figures according to these figures without paying creative work.

DETAILED DESCRIPTION OF THE EMBODIMENT

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
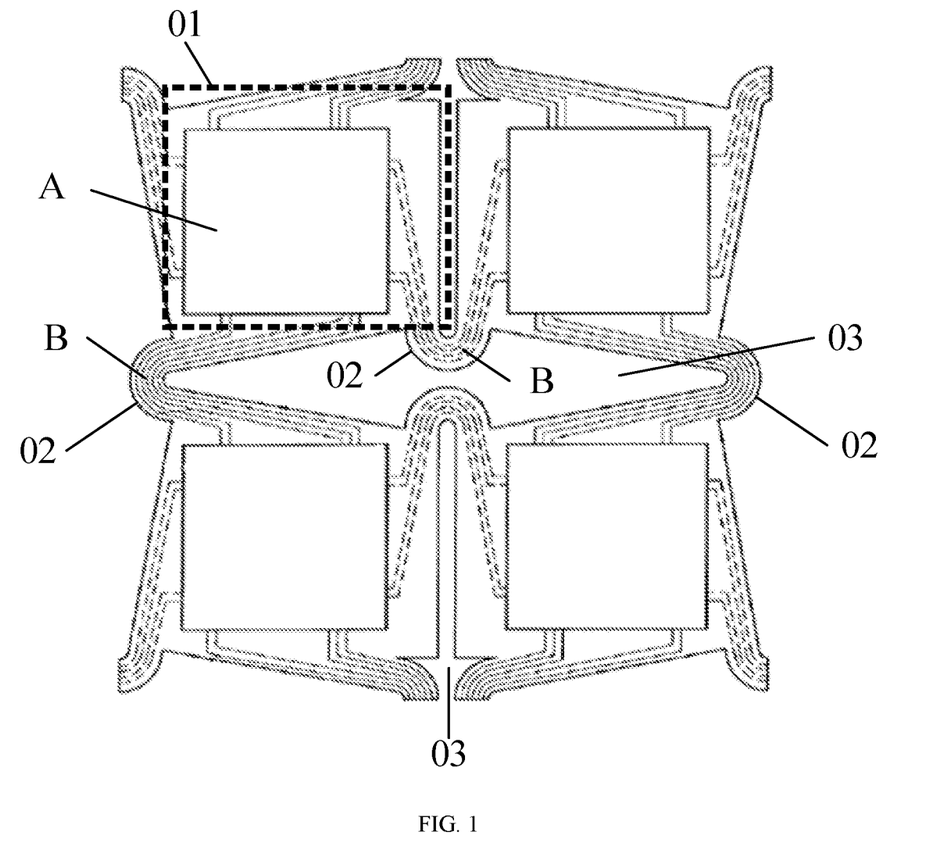
FIG. 1 illustrates a top view of a related stretchable display panel.
Figure 2:
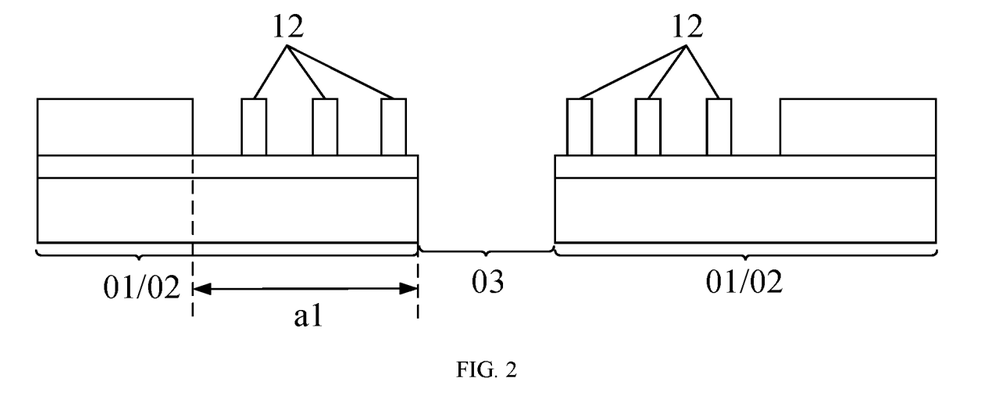
FIG. 2 illustrates a cross-sectional view of a related stretchable display panel.

As referring to FIG. 1, illustrating a top view of a stretchable display panel. As referring to FIG. 2, illustrating a cross-sectional view of a stretchable display panel. As shown in FIG. 1, the stretchable display panel includes an island region 01 with a display apparatus A, a bridge region 02 with wirings B, and a hole-region 03 for providing deformation. In practical applications, for stretchable display panels with similar structures, isolation columns 12 are usually disposed at an edge of the island region 01 or an edge of the bridge region 02, as shown in FIG. 2, it is configured to prevent cracks caused by excessive stretching extend to the display apparatus region and thus causing damage of the display apparatus. However, for the stretchable display panel as mentioned above, space for placing the isolation columns at the edge of the panel is a bit insufficient. Therefore, the crack isolation effect of the panel is poor. In addition, an encapsulation distance of the edge of the panel is short, so that the panel encapsulation effect is poor.

Figure 3:
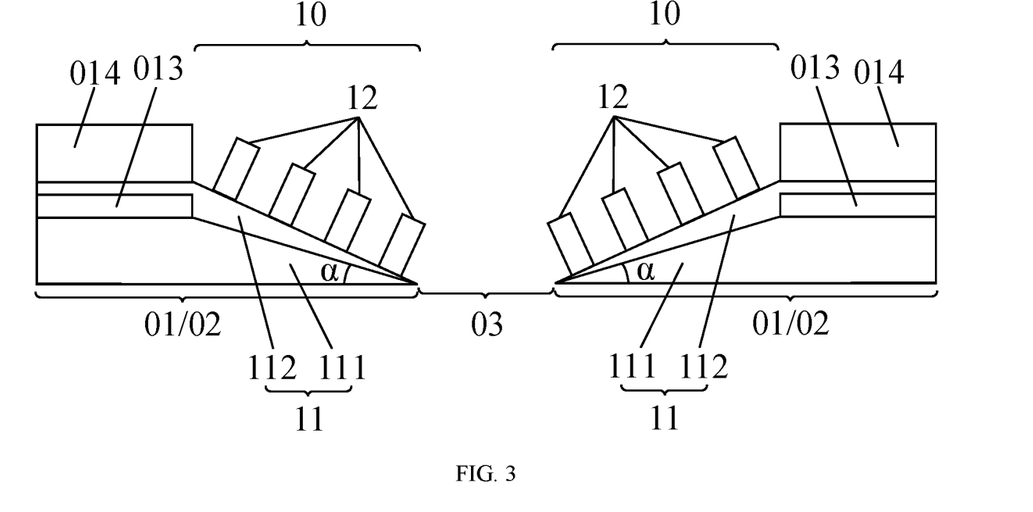
FIG. 3 illustrates a cross-sectional view of a stretchable display panel of an embodiment of the present disclosure.

FIG. 3 illustrates a cross-sectional view of the stretchable display panel of an embodiment of the present disclosure, as referring to FIG. 3, the stretchable display panel includes the island region 01 with the display apparatus A, the bridge region 02 with the wirings B, and the hole-region 03. The edge of the island region 01 and/or the edge of the bridge region 02 is disposed with an isolation area 10 and the isolation area 10 includes a slope layer 11 and a plurality of isolation columns 12 disposed along a slope plane of the slope layer 11.

Figure 4:
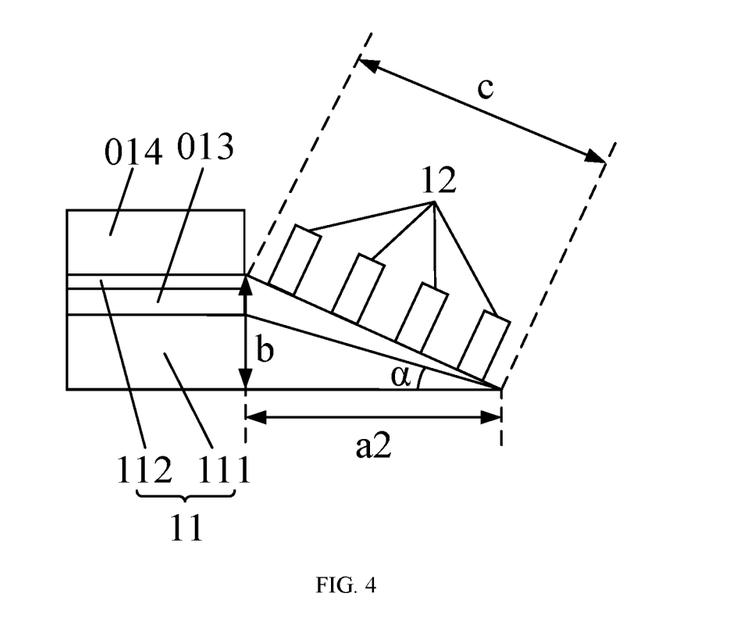
FIG. 4 illustrates another cross-sectional view of the stretchable display panel of an embodiment of the present disclosure.

In an embodiment of the present disclosure, the isolation area 10 at the edge of the island region 01 and/or the bridge region 02 may be disposed as the slope layer 11 with a slope surface, so that the isolation columns 12 may be disposed along the slope plane of the slope layer 11. FIG. 4 illustrates another cross-sectional view of the stretchable display panel of an embodiment of the present disclosure, based on the perspective of FIG. 4, a bottom side distance of the slope layer 11 may be a2, a maximum height of the slope layer 11 may be b, a length of the slope layer may be c, as referring to FIG. 2 at the same time, a width of an isolation area of a related stretchable display panel may be a1, in a situation of a1=a2, a width of the isolation area of the stretchable display panel provided by the embodiment of the present disclosure may reach $\sqrt{a_1^2+b^2}$ (greater than a1). However, in a situation of a1<a2, the width of the isolation area of the stretchable display panel provided by the embodiment of the present disclosure may be larger, as reaching $\sqrt{a_2^2+b^2}$ (greater than $\sqrt{a_1^2+b^2}$). Therefore, in the embodiment of the present disclosure, the slope plane may increase a space for placing the isolation columns at the edge of the panel, so that more isolation columns may be placed in the space for placing the isolation columns, and enhancing the crack isolation effect of the panel. In addition, due to the width of the isolation area of the panel is increased, that is, the encapsulation distance of the edge of the panel is extended, thus enhancing the encapsulation effect of the panel.

Optionally, as referring to FIG. 3, the slope layer 11 includes a flexible substrate 111 and a first buffer layer 112 disposed on the flexible substrate 111, the plurality of isolation columns 12 are disposed on the first buffer layer 112.

Wherein, the flexible substrate 111 may ensure stretch ability of the panel, and the first buffer layer 112 may play a buffer role between the flexible substrate 111 and the isolation columns 12.

Optionally, as referring to FIG. 3, a slope-plane angle α of the flexible substrate 111 is greater than 0 degree and less than or equal to 30 degrees.

Wherein, the slope-plane angle is an angle between the slope plane and a horizontal plane. The slope-plane angle α of the flexible substrate 111 may be controlled in a range as greater than 0 degree and less than or equal to 30 degrees, that is that a slope of the slope layer 11 may be disposed slower, so that more isolation columns 12 may be disposed on the slower slope, to further enhance the crack isolation effect of the panel, and, the panel encapsulation distance of the edge of the panel is further extended, therefore, the encapsulation effect of the panel may be further enhanced.

Optionally, a slope-plane angle of the first buffer layer is less than that of the flexible substrate.

Wherein, the slope angle of the first buffer layer is an included angle between the slope plane of the first buffer layer and the slope plane of the flexible substrate. As the slope-plane angle of the first buffer layer is less than the slope-plane of the flexible substrate, the overall slope of the slope layer 11 may be disposed slower, so that more isolation columns 12 may be disposed on the slope layer 11 to further enhance the crack isolation effect of the display panel.

Optionally, a second buffer layer located between the flexible substrate and the first buffer layer is also included, and the second buffer layer does not overlap with the plurality of isolation columns. Wherein, the second buffer layer does not overlap with the plurality of isolation columns, that is, the second buffer layer does not contact or overlap with the plurality of isolation columns. In addition, the second buffer may not overlap with the slope plane of the first buffer, that is, the second buffer does not contact or overlap with the slope plane of the first buffer. Optionally, in practical applications, the isolation column 12 may be made of metallic materials and/or organic materials, which is not limited in the embodiment of the present disclosure.

In addition, the isolation area 10 may also include a luminescent-material layer covering the isolation columns 12, as well as an encapsulation layer covering the luminescent-material layer and other conventional film-layer structures, which are not specifically limited in the embodiment of the present disclosure. Wherein, the luminescent-material layer covering the isolation columns 12 is a part that the luminescent-material layer of the display apparatus part extends to the isolation area 10.

In an embodiment of the present disclosure, the stretchable display panel includes an island region disposed with a display apparatus, a bridge region disposed with wirings, and a hole-region, an edge of the island region and/or the bridge region disposed with an isolation area, and the isolation area includes a slope layer and the plurality of isolation columns disposed along a slope plane of the slope layer. In the embodiment of the present disclosure, the isolation area of the edge of the panel may be disposed as the slope layer with the slope plane, so that more isolation columns may be disposed on the slope plane of the slope layer, the slope plane may increase space of placing the isolation columns at the edge of the panel, so that more isolation columns may be disposed in the placing space of the isolation columns, thus enhancing the crack isolation effect of the panel. In addition, due to a width of the isolation area of the panel increases, that is, an encapsulation distance of the edge of the panel is extended, thereby enhancing the encapsulation effect of the panel.

Figure 5:
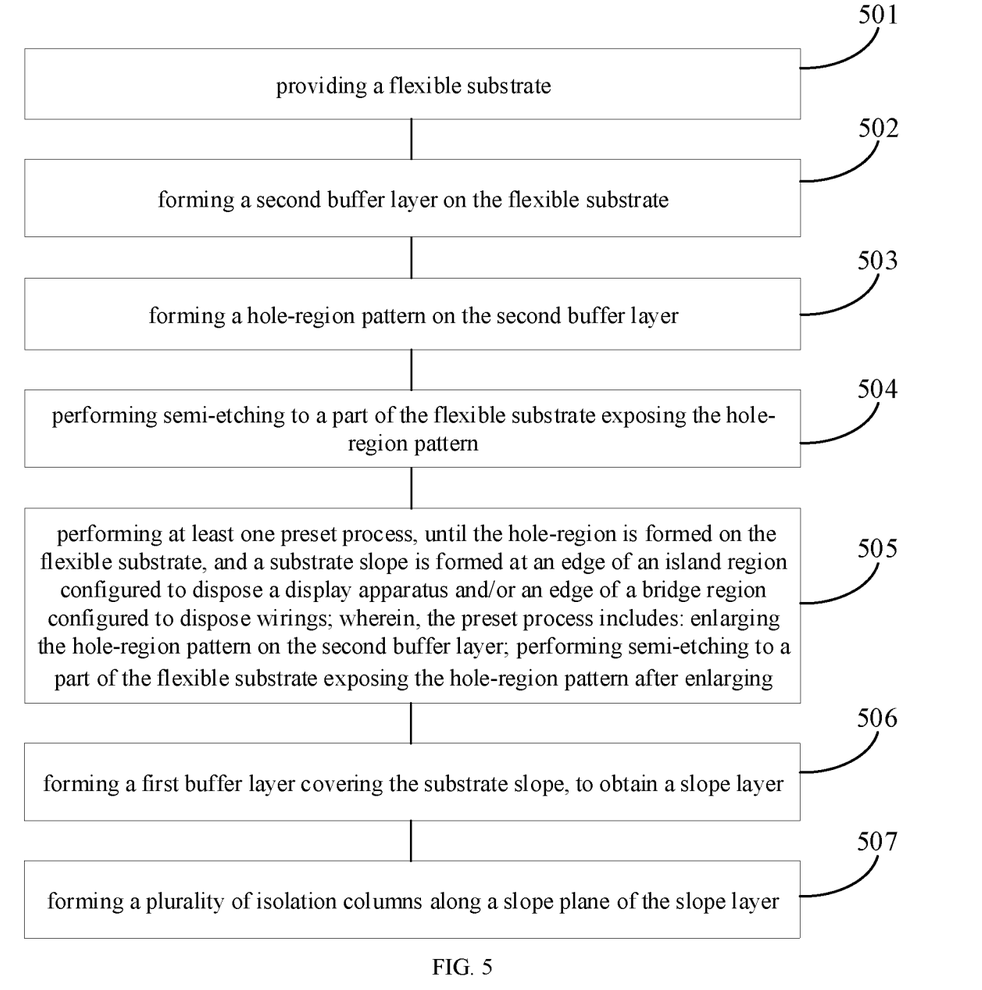
FIG. 5 illustrates a step flow chart of a preparation method of a stretchable display panel of an embodiment of the present disclosure.

As referring to FIG. 5, which illustrates a step flow chart of a preparation method of a stretchable display panel of an embodiment of the present disclosure, the preparation method includes the following steps as below:

step 501: providing a flexible substrate.

In practical applications, the flexible substrate 111 may be made of polyimide (PI) and other flexible materials, which are not specifically limited in the embodiment of the present disclosure.

step 502: forming a second buffer layer on the flexible substrate.

In this step, forming a second buffer layer 013 on the flexible substrate 111. In practical applications, the second buffer layer 013 may be made of SiNx, SiOx and other materials, which are not specifically limited in the embodiment of the present disclosure.

step 503: forming a hole-region pattern on the second buffer layer.

Optionally, this step may be implemented by methods below, includes: forming a patterned photoresist layer on the second buffer layer; performing etching a part of the second buffer layer exposing the patterned photoresist layer, to form a hole-region pattern.

Figure 6:
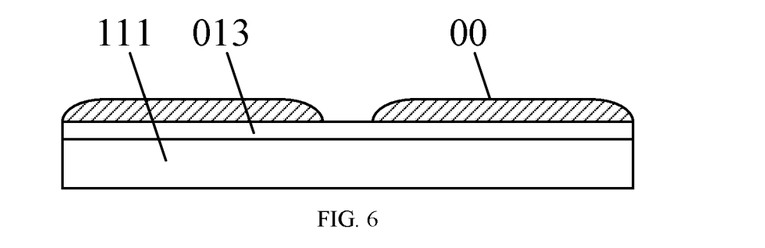
FIG. 6 illustrates a schematic diagram of a panel after forming a patterned photoresist layer on a second buffer layer of an embodiment of the present disclosure.
Figure 7:
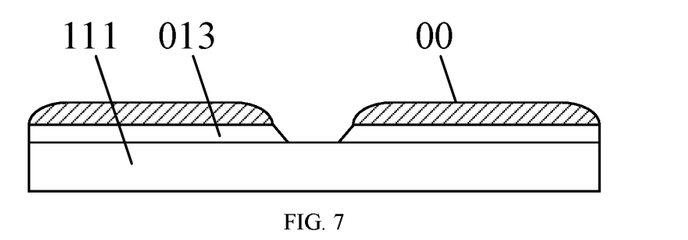
FIG. 7 illustrates a schematic diagram of a panel after forming a hole-region pattern by performing etching a part of a second buffer layer exposing a patterned photoresist layer of an embodiment of the present disclosure.

First, photoresist may be coated on the second buffer layer 013, and then the patterned photoresist layer 00 may be formed on the second buffer layer 013 through exposing, developing, etching and other processes, as shown in FIG. 6. After then, it may perform etching the part of the second buffer 013 exposing the patterned photoresist layer 00, to form the hole pattern on the second buffer 013, as shown in FIG. 7. As referring to FIG. 7, after the hole pattern is etched on the second buffer layer 013, a certain slope may be naturally formed at the edge close to the hole-region pattern of the second buffer layer 013.

In an embodiment of the present disclosure, optionally, the step of performing etching a part of the second buffer layer exposing a patterned photoresist layer, to form a hole-region pattern, may specifically include: performing etching a part of the second buffer layer exposing a patterned photoresist layer by tetrafluoromethane gas, to form a hole-region pattern.

In practical applications, it may through the tetrafluoromethane ($CF_4$) gas, performing inductively coupled plasma (ICP) etching a part of the second buffer layer 013 exposing the photoresist layer. Through the tetrafluoromethane gas, performing etching the second buffer layer 013 may avoid damages to the photoresist layer 00 and the flexible substrate 111.

step 504: performing semi-etching a part of the flexible substrate exposing the hole-region pattern.

In an embodiment of the present disclosure, optionally, before or after the step, the method may further include the following steps as below: through an ashing process, performing etching the photoresist layer along a direction away from the hole-region pattern, to expose a part of the second buffer layer.

Figure 8:
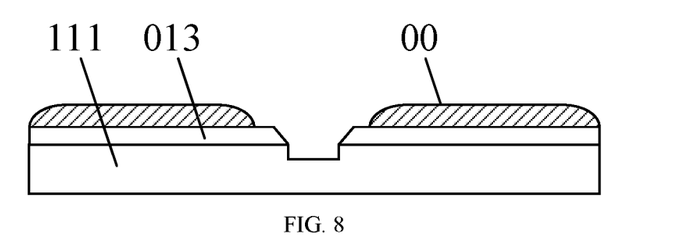
FIG. 8 illustrates a schematic diagram of a panel that is obtained by firstly etching a photoresist layer along a direction away from the hole-region pattern to expose a part of the second buffer layer, and then semi-etching a part of a flexible substrate exposing the hole-region pattern of an embodiment of the present disclosure.

Wherein, the photoresist layer 00 may be etched along a direction away from the hole-region pattern through the ashing process, to expose a part of the second buffer layer 013. That is, it may perform drawing-in to the photoresist layer 00, as shown in FIG. 8. The indrawn photoresist layer 00 is for subsequent etching the second buffer layer 013, drawing-in the photoresist layer 00 after this step, a certain drawing-in rick may also exist to the flexible substrate 111, that is, a risk of that the pattern on the flexible substrate 111 may be destroyed after semi-etching may exist, however, drawing-in the photoresist layer 00 before this step, the drawing-in risk of the flexible substrate may be avoided.

Optionally, this step may be specifically implemented by following methods below, includes: performing semi-etching a part of the flexible substrate exposing the hole-region pattern through oxygen gas.

In practical applications, a plasma reactive ion etching (plasma RIE) process may be used, through oxygen ($O_2$) gas, performing semi-etching a part of the flexible substrate 111 exposing a hole-region pattern along a direction perpendicular to the panel, as shown in FIG. 8. Performing etching the flexible substrate 111 through oxygen gas, damages to the second buffer layer 013 may be avoided.

step 505: performing at least one preset process, until the hole-region is formed on the flexible substrate, and a substrate slope is formed at an edge of an island region configured to dispose a display apparatus and/or an edge of a bridge region configured to dispose wirings; wherein, the preset process includes: enlarging the hole-region pattern on the second buffer layer; performing semi-etching a part of the flexible substrate exposing the hole-region pattern after enlarging.

In an embodiment of the present disclosure, optionally, the step of enlarging the hole-region pattern on the second buffer layer may specifically include: performing etching a part of the second buffer layer exposing the photoresist layer.

Figure 9:
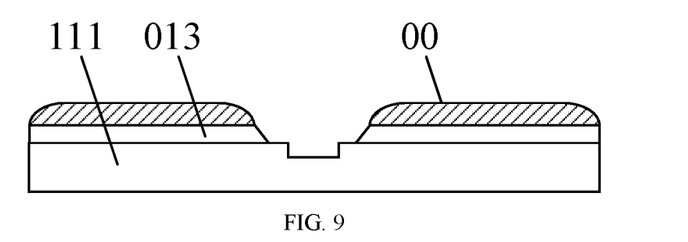
FIG. 9 illustrates a schematic diagram of a panel after enlarging the hole-region pattern on the second buffer layer of an embodiment of the present disclosure.

After the ashing process, the part close to the hole-region of the second buffer layer 013 exposes the photoresist layer 00, after that, the part of the second buffer layer 013 exposing the photoresist layer 00 may be etched, therefore the hole-region pattern on the second buffer layer 013 may be enlarged, as shown in FIG. 9.

Optionally, the step of performing etching a part of the second buffer layer exposing the photoresist layer may also specifically include: performing etching a part of the second buffer layer exposing the photoresist layer by the tetrafluoromethane gas.

In practical applications, it may by the tetrafluoromethane gas, to perform inductively couple plasma (ICP) etching the part of the second buffer layer 013 exposing the photoresist layer 00. The second buffer layer 013 is performed etching by the tetrafluoromethane gas to avoid damages to the photoresist layer 00 and the flexible substrate 111.

Optionally, before or after the step of performing semi-etching a part of the flexible substrate exposing the hole-region pattern after enlarging, the method may further include steps as following: through the ashing process, performing etching the photoresist layer along a direction away from the hole-region pattern after enlarging, to expose a part of the second buffer layer.

Figure 10:
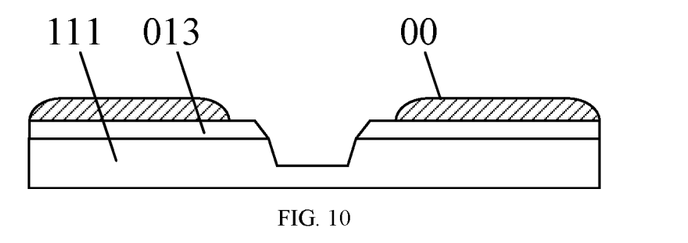
FIG. 10 illustrates a schematic diagram of a panel after etching the photoresist layer along a direction away from the hole-region pattern after enlarging, to expose a part of the second buffer layer of an embodiment of the present disclosure.

Wherein, it may through the ashing process, to perform etching the photoresist layer 00 along a direction away from the hole-region pattern, to expose a part of the second buffer layer 013, that is performing drawing-in to the photoresist 00, as shown in FIG. 10. The indrawn photoresist layer 00 is for subsequent etching the second buffer layer 013 again, drawing-in the photoresist layer 00 before this step, the drawing-in risk of the flexible substrate 111 may be avoided.

Optionally, the step of performing semi-etching a part of the flexible substrate exposing the hole-region pattern after enlarging may specifically include: performing semi-etching a part of the flexible substrate exposing the hole-region pattern after enlarging by oxygen gas.

In practical applications, Plasma IRE process may be used, through oxygen gas, performing semi-etching the part of the flexible substrate 111 exposing the hole-region pattern after enlarging along a direction perpendicular to the panel, as shown in FIG. 10. Performing etching the flexible substrate 111 by oxygen gas, damages to the second buffer layer 013 may be avoided.

Figure 11:
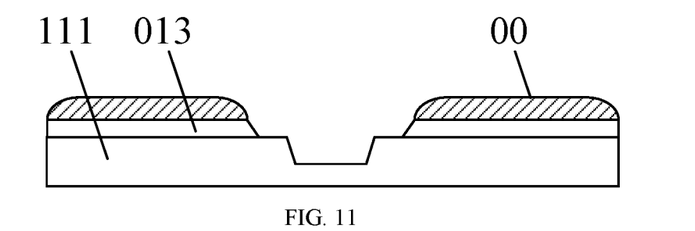
FIG. 11 illustrates a schematic diagram of a panel after continually enlarging the hole-region pattern on the second buffer layer of an embodiment of the present disclosure.
Figure 12:
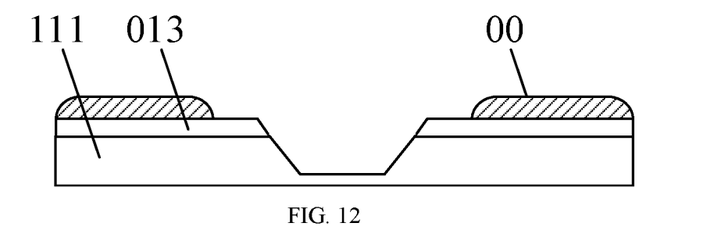
FIG. 12 illustrates a schematic diagram of a panel that is obtained by firstly performing continually etching a photoresist layer along a direction away from the enlarged hole-region pattern to expose a part of the second buffer layer, and then semi-etching a part of a flexible substrate exposing the hole-region pattern of an embodiment of the present disclosure.

And then, it may repeat performing the preset process, to enlarge the hole-region pattern on the second buffer layer 013, as shown in FIG. 11, and performing semi-etching the part of the flexible substrate 111 exposing the hole-region pattern after enlarging, as shown in FIG. 12.

Figure 13:
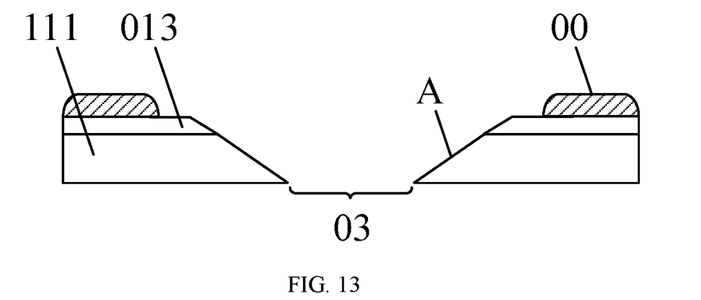
FIG. 13 illustrates a schematic diagram of a panel of forming a hole-region on a flexible substrate, and forming a substrate slope at an edge of an island region configured to dispose a display apparatus and/or an edge of a bridge region configured to dispose wirings of an embodiment of the present disclosure.

In an embodiment of the present disclosure, the slope of the flexible substrate 111 may become slower with each preset process accomplished. In specific applications, at least one preset process may be performed, until a hole-region is formed on the flexible substrate 111, and a substrate slope A at an edge of the island region configured to dispose a display apparatus and/or at an edge of the bridge region configured to dispose wirings, as shown in FIG. 13. Wherein, a slope-plane angle of the substrate slope A is positively correlated with times of performing the preset process, that is, more times of performing the preset process, larger the slope-plane angle of the substrate slope A. The slope-plane angle of the substrate slope A is positively correlated with an etching duration of performing semi-etching the part of the flexible substrate 111 exposing the hole-region pattern after enlarging, that is, the etching duration of performing semi-etching the part of the flexible substrate 111 exposing the hole-region pattern after enlarging is longer, the slope-plane angle of the substrate slope A is larger.

In practical applications, at least one preset process may be performed, at the same time until a hole-region is formed, a desired slope-plane angle of the substrate slope is reached. It should be noted that, due to the hole-region needs to penetrate the panel, therefore, during the last time of performing the preset process, on the condition that remaining part of the hole-region corresponding to the flexible substrate 111 is very thin, performing full-etching a part of the flexible substrate 111 exposing the hole-region pattern after enlarging, so that the hole-region is formed. Certainly, it may after the last time of performing the preset process accomplished, then perform full-etching the part of the substrate 111 corresponding to the hole-region, so that the hole-region is formed, which will not be limited in the embodiment of the present disclosure.

Figure 14:
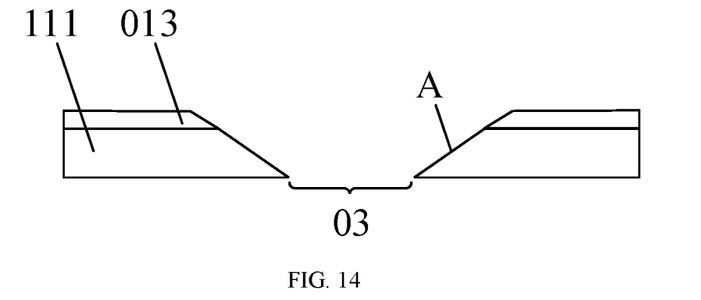
FIG. 14 illustrates a schematic diagram of a panel after stripping a photoresist layer of an embodiment of the present disclosure.

At least one preset process is performed completely, and after the hole-region 03 is formed on the flexible substrate 111, and the substrate slope A is formed at an edge of the island region configured to dispose a display apparatus and/or at an edge of the bridge region configured to dispose wirings, the photoresist layer 00 may be stripped, as shown in FIG. 14.

step 506: forming a first buffer layer covering the substrate slope, to obtain a slope layer.

Figure 15:
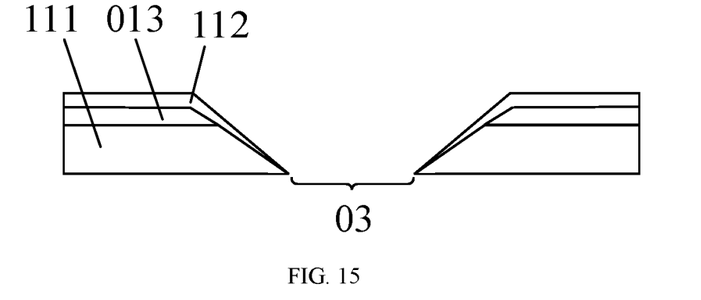
FIG. 15 illustrates a schematic diagram of a panel after obtaining a slope layer and forming a first buffer layer covering the substrate slope of an embodiment of the present disclosure.

In this step, due to the second buffer layer 013 is etched by multiple times at stages such as preset process, therefore, the substrate slope of the flexible substrate 111 is only covered by very little second buffer layer 013. Therefore, a first buffer layer 112 may be formed on the substrate slope to cover the substrate slope, as shown in FIG. 15, thereby to obtain the slope layer. Wherein, the first buffer layer 112 may be play a buffer role between the substrate slope and the isolation columns which are subsequently disposed.

step 507: forming a plurality of isolation columns along a slope plane of the slope layer.

Figure 16:
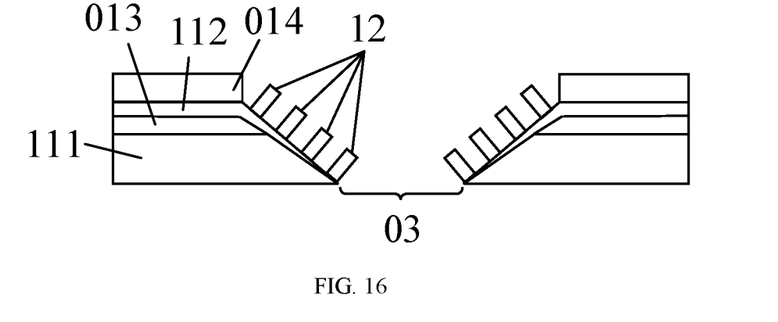
FIG. 16 illustrates a schematic diagram of a panel after forming a plurality of isolation columns along a slope plane of the slope layer of an embodiment of the present disclosure.

In this step, the plurality of isolation columns 12 may be formed on a slope plane of the slope layer, as shown in FIG. 16. Specifically, first, forming isolation-column films 014 on the slope plane of the slope layer, and then forming the plurality of isolation columns 12 located in the isolation area through a patterning process.

In practical applications, the isolation-column films 014 may be one of a cushion (PS) layer, a flat (PLN) layer of a display apparatus part, and a source-drain (SD) layer of a thin film transistor which extends to a part on the slope plane of the slope layer, that is, the isolation columns 12 may specifically include one of the followings: the PS layer, the PLN layer and the SD layer.

For example, extending the PLN layer of the display apparatus part to the part of the slope plane of the slope layer as the isolation-column films 014, then the isolation columns 12 are PLN isolation columns 12. For another example, extending the SD layer and the PLN layer of the display apparatus part to the part of the slope plane of the slope layer as the isolation-column films 014, then the isolation columns 12 are SD+PLN isolation columns 12, wherein, the SD layer in the SD+PLN isolation columns 12 may be disposed close to the slope layer, and the PLN layer in the SD+PLN isolation columns 12 may locate at one side of the SD layer away from the slope layer.

In an embodiment of the present disclosure, due to the slope-plane angle of the slope layer is determined by the slope angle of the substrate slope to a great extent, therefore, optionally, the slope-plane angle of the slope layer is positively correlated with times of performing the preset process. Optionally, a slope-plane angle of the slope layer is positively correlated with an etching duration of performing semi-etching the part of the flexible substrate exposing the hole-region pattern after enlarging. Therefore, in practical applications, by increasing times of performing the preset process in a reasonable range, and/or the etching duration of performing semi-etching the part of the flexible substrate exposing the hole-region pattern after enlarging, so that a slower slope plane of the slope layer may be obtained, and more isolation columns may be disposed on the gentler slope plane, to further enhance the crack isolation effect of the panel, and, the encapsulation distance of the edge of the panel is further extended, so the encapsulation effect of the panel may be further enhanced.

In addition, the preparation method may further include conventional steps such as forming the encapsulation layer which may not be specifically limited in the embodiment of the present disclosure.

In an embodiment of the present disclosure, the preparation method of the stretchable display panel may include: providing a flexible substrate; forming a second buffer layer on the flexible substrate; forming a hole-region pattern on the second buffer layer; performing semi-etching a part of the flexible substrate exposing the hole-region pattern; performing at least one preset process, until a hole-region is formed on the flexible substrate, and a substrate slope is formed at an edge of an island region configured to dispose a display apparatus and/or an edge of a bridge region configured to dispose wirings; forming a first buffer layer covering the substrate slope, to obtain a slope layer; forming a plurality of isolation columns along a slope plane of the slope layer. Wherein, the preset process includes: enlarging a hole-region pattern on the second buffer layer; performing semi-etching a part of the flexible substrate exposing the hole-region pattern after enlarging. In the embodiment of the present disclosure, through the method as mentioned above, a slope layer may be formed at the isolation area of an edge of the island region and/or the bridge region of the stretchable display panel, and a plurality of the isolation columns may be formed along the slope plane of the slope layer. The slope plane may increase space of placing the isolation columns at the edge of the panel, so that more isolation columns may be disposed in the placing space of the isolation columns, thus enhancing the crack isolation effect of the panel. In addition, due to the width of the isolation area of the panel increases, that is, the encapsulation distance of the edge of the panel is extended, thereby enhancing the encapsulation effect of the panel.

An embodiment of the present disclosure further discloses a display apparatus, which includes the stretchable display panel as mentioned above.

In the embodiment of the present disclosure, the stretchable display panel includes an island region disposed with a display apparatus, a bridge region disposed with wirings, and a hole-region, an edge of the island region and/or the bridge region disposed with an isolation area, and the isolation area includes a slope layer and a plurality of isolation columns disposed along a slope plane of the slope layer. In the embodiment of the present disclosure, the isolation area of the edge of the panel may be disposed as the slope layer with the slope plane, and more isolation columns may be disposed on the slope plane of the slope layer, the slope plane may increase space of placing the isolation columns at the edge of the panel, so that more isolation columns may be disposed in the placing space of the isolation columns, thus enhancing the crack isolation effect of the panel. In addition, due to the width of the isolation area of the panel increases, that is, the encapsulation distance of the edge of the panel is extended, thereby enhancing the encapsulation effect of the panel.

As to the various embodiments of methods as mentioned above, in order to easily describe, the above embodiments are expressed as a series of action combinations. However, those skilled in the art should know that the present disclosure is not limited by the described action sequence, because according to the present disclosure, some steps may be carried out in other sequences or at the same time. Secondly, those skilled in the art should also know that the embodiments described in the specification belong to the preferred embodiments, and the actions and modules involved are not necessary for the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The stretchable display panel, a preparation method therefor, and a display apparatus. according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A stretchable display panel, wherein, the stretchable display panel comprises an island region disposed with a display apparatus, a bridge region disposed with wirings and a hole-region, an isolation area is disposed at an edge of the island region and/or an edge of the bridge region, the isolation area comprises a slope layer and a plurality of isolation columns disposed along a slope plane of the slope layer, wherein the slope layer comprises a flexible substrate and a first buffer layer disposed on the flexible substrate, and the plurality of isolation columns are disposed on the first buffer layer.

2. The display panel according to claim 1, wherein a slope-plane angle of the flexible substrate is greater than 0 degree and less than or equal to 30 degrees.

3. The display panel according to claim 1, wherein, a slope-plane angle of the first buffer layer is less than a slope-plane angle of the flexible substrate.

4. The display panel according to claim 1, wherein the stretchable display panel further comprises a second buffer layer located between the flexible substrate and the first buffer layer, and the second buffer layer does not overlap with the plurality of isolation columns.

5. The display panel according to claim 4, wherein, the stretchable display panel further comprises a patterned photoresist layer, and the patterned photoresist layer is located on the second buffer layer.

6. The display panel according to claim 1, wherein, the stretchable display panel further comprises a second buffer layer located between the flexible substrate and the first buffer layer, and the second buffer layer does not overlap with the slope plane of the first buffer layer.

7. The display panel according to claim 1, wherein the isolation columns comprise at least one of a cushion layer, a flat layer and a source-drain layer.

8. The display panel according to claim 1, wherein the isolation area further comprises a luminescent-material layer covering the plurality of isolation columns, and an encapsulation layer covering the luminescent-material layer.

9. A display apparatus, wherein, the display apparatus comprises the stretchable display panel according to claim 1.

10. The display apparatus according to claim 9, wherein, the slope layer comprises a flexible substrate and a first buffer layer disposed on the flexible substrate, and the plurality of isolation columns are disposed on the first buffer layer.

11. A preparation method for a stretchable display panel, wherein the method comprises:
providing a flexible substrate;
forming a second buffer layer on the flexible substrate;
forming a hole-region pattern on the second buffer layer;
performing semi-etching a part of the flexible substrate exposing the hole-region pattern;
performing at least one preset process, until a hole-region is formed on the flexible substrate, and a substrate slope is formed at an edge of an island region for disposing a display apparatus and/or an edge of a bridge region for disposing wirings;
forming a first buffer layer covering the substrate slope, to obtain a slope layer;
forming a plurality of isolation columns along a slope plane of the slope layer;
wherein, the preset process comprises: enlarging the hole-region pattern on the second buffer layer; and performing semi-etching a part of the flexible substrate exposing the hole-region pattern after enlarging.

12. The method according to claim 11, wherein, forming the hole-region pattern on the second buffer layer comprises:
forming a patterned photoresist layer on the second buffer layer; and
performing etching a part of the second buffer layer exposing the patterned photoresist layer, to form the hole-region pattern.

13. The method according to claim 12, wherein, before or after performing semi-etching a part of the flexible substrate exposing the hole-region pattern, the method further comprises:
through an ashing process, performing etching the photoresist layer along a direction away from the hole-region pattern, to expose a part of the second buffer layer.

14. The method according to claim 12, wherein, enlarging the hole-region pattern on the second buffer layer comprises:
performing etching the part of the second buffer layer exposing the patterned photoresist layer.

15. The method according to claim 14, wherein, performing etching the part of the second buffer layer exposing the photoresist layer comprises:
performing etching the part of the second buffer layer exposing the photoresist layer by tetrafluoromethane gas.

16. The method according to claim 11, wherein, performing semi-etching the part of the flexible substrate exposing the hole-region pattern comprises:
performing semi-etching the part of the flexible substrate exposing the hole-region pattern by oxygen gas.

17. The method according to claim 11, wherein, a slope-plane angle of the slope layer is positively correlated with times of performing the preset process.

18. The method according to claim 11, wherein, a slope-plane angle of the slope layer is positively correlated with an etching duration of performing semi-etching the part of the flexible substrate exposing the hole-region pattern after enlarging.

19. The method according to claim 11, wherein, forming the plurality of isolation columns along the slope plane of the slope layer comprises: forming isolation-column films on the slope plane of the slope layer, and forming the plurality of isolation columns located in an isolation area through a patterning process.

* * * * *